United States Patent
Ryoo et al.

(10) Patent No.: US 9,230,642 B2
(45) Date of Patent: Jan. 5, 2016

(54) VARIABLE RESISTANCE MEMORY DEVICE AND A VARIABLE RESISTANCE MEMORY SYSTEM INCLUDING THE SAME

(71) Applicant: SAMSUNG ELECTRONICS CO., LTD., Suwon-si, Gyeonggi-do (KR)

(72) Inventors: Kyung-chang Ryoo, Seongnam-si (KR); Hongsik Jeong, Seongnam-si (KR); Daehwan Kang, Seoul (KR); JaeHee Oh, Seongnam-si (KR); Jihyung Yu, Anyang-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/257,391

(22) Filed: Apr. 21, 2014

(65) Prior Publication Data

US 2015/0043267 A1 Feb. 12, 2015

(30) Foreign Application Priority Data

Aug. 6, 2013 (KR) .......................... 10-2013-0093200

(51) Int. Cl.

| G11C 11/00 | (2006.01) |
|---|---|
| G11C 13/00 | (2006.01) |
| G11C 14/00 | (2006.01) |
| H01L 45/00 | (2006.01) |
| H01L 27/22 | (2006.01) |
| H01L 27/24 | (2006.01) |

(52) U.S. Cl.
CPC ........ G11C 13/0004 (2013.01); G11C 13/0007 (2013.01); G11C 14/00 (2013.01); H01L 27/224 (2013.01); H01L 27/2409 (2013.01); H01L 27/2481 (2013.01); H01L 45/06 (2013.01); H01L 45/1233 (2013.01); H01L 45/143 (2013.01); H01L 45/144 (2013.01); H01L 45/146 (2013.01); H01L 45/165 (2013.01); G11C 2213/32 (2013.01); G11C 2213/72 (2013.01); H01L 27/2463 (2013.01)

(58) Field of Classification Search
CPC .. G11C 13/0004; G11C 13/007; G11C 14/00; G11C 2213/32; G11C 2213/72; H01L 27/2463; H01L 27/224; H01L 27/2409; H01L 27/2481; H01L 48/06; H01L 45/1233; H01L 45/143; H01L 14/144; H01L 45/146; H01L 45/165
USPC .................................................. 365/148, 100
See application file for complete search history.

(56) References Cited

U.S. PATENT DOCUMENTS

| 7,656,719 | B2 * | 2/2010 | Cho et al. ................. 365/189.05 |
|---|---|---|---|
| 7,944,764 | B1 | 5/2011 | Qawami et al. |
| 8,037,234 | B2 | 10/2011 | Yu et al. |

(Continued)

*Primary Examiner* — Pho M Luu
(74) *Attorney, Agent, or Firm* — F. Chau & Associates, LLC

(57) ABSTRACT

A variable resistance memory system includes a variable resistance memory device including a memory cell array including first and second areas; and a memory controller configured to control the variable resistance memory device. The first area includes first variable resistance memory cells including a first variable resistance material layer and the second area includes second variable resistance memory cells including a second variable resistance material layer having a metallic doping concentration higher than a metallic doping concentration of the first variable resistance material layer. The first variable resistance memory cells are used as storage and the second variable resistance memory cells are used as a buffer memory.

20 Claims, 12 Drawing Sheets

(56) References Cited

U.S. PATENT DOCUMENTS

| | | |
|---|---|---|
| 8,111,559 B2 | 2/2012 | Kwon et al. |
| 8,259,511 B2 * | 9/2012 | Cho et al. ............... 365/189.05 |
| 8,482,961 B2 * | 7/2013 | Hanzawa et al. ............ 365/148 |
| 8,553,444 B2 * | 10/2013 | Muraoka et al. ............ 365/148 |
| 8,885,387 B2 * | 11/2014 | Azuma et al. ............... 365/148 |
| 2009/0182933 A1 | 7/2009 | Jang et al. |
| 2009/0193184 A1 | 7/2009 | Yu et al. |
| 2010/0082890 A1 | 4/2010 | Heo et al. |
| 2010/0214813 A1 | 8/2010 | Choi et al. |
| 2010/0293317 A1 | 11/2010 | Confalonieri et al. |
| 2011/0089553 A1 | 4/2011 | Kim et al. |
| 2011/0131472 A1 | 6/2011 | Antonakopoulos et al. |
| 2011/0283039 A1 | 11/2011 | Terao et al. |
| 2012/0096217 A1 | 4/2012 | Son et al. |
| 2012/0096246 A1 | 4/2012 | Pio |
| 2012/0239856 A1 | 9/2012 | Cho |
| 2012/0246392 A1 | 9/2012 | Cheon |
| 2012/0248400 A1 | 10/2012 | Yu et al. |

* cited by examiner

VARIABLE RESISTANCE MEMORY DEVICE AND A VARIABLE RESISTANCE MEMORY SYSTEM INCLUDING THE SAME

CROSS-REFERENCE TO RELATED APPLICATION

This application claims priority under 35 U.S.C. §119 to Korean Patent Application No. 10-2013-0093200, filed on Aug. 6, 2013 in the Korean Intellectual Property Office, the disclosure of which is incorporated by reference herein in its entirety.

TECHNICAL FIELD

The present inventive concept relates to a semiconductor memory, and more particularly, to a variable resistance memory device and a variable resistance memory system including the same.

DISCUSSION OF THE RELATED ART

A semiconductor memory device can be classified as a volatile memory device and a nonvolatile memory device. The volatile memory device loses its stored data when it is not powered. Examples of the volatile memory device include a dynamic random access memory (DRAM), a static RAM (SRAM), etc. The nonvolatile memory device retains its stored data even when it is not powered. Examples of the nonvolatile memory device include a programmable read only memory (PROM), an erasable PROM (EPROM), an electrically EPROM (EEPROM), a flash memory, etc.

As technology advances, a high speed storage medium is sometimes required. A flash memory based solid state drive (SSD) can be provided with high speed and high integration. However, since an operation speed of a flash memory is slower than a DRAM, an SSD may use a DRAM as a buffer memory. Further, due to physical characteristics and high integration of a flash memory, a structure thereof may include a complicated memory controller to perform operations such as a flash translation layer, an error correction code, etc.

To replace the flash memory and the RAM devices described above, next generation semiconductor memory devices such as a ferroelectric RAM (FRAM), a magnetic RAM (MRAM), a phase-change RAM (PRAM), etc. are being developed. Materials constituting these next generation semiconductor memory devices have different resistances depending on a current or a voltage, have a characteristic of retaining their resistance value in the absence of a current or voltage supply and provide a high operation speed, for example.

A phase-change memory device using a phase-change material can be made to achieve high-integration or high performance relatively easily. However, when a phase-change memory device becomes highly integrated, its operation performance can be degraded, and conversely, when its operation performance is increased, the phase-change memory device may not be highly integrated efficiently.

SUMMARY

An exemplary embodiment of the inventive concept provides a variable resistance memory system. The variable resistance memory system may include a variable resistance memory device comprising a memory cell array including first and second areas; and a memory controller configured to control the variable resistance memory device. The first area comprises first variable resistance memory cells including a first variable resistance material layer and the second area comprises second variable resistance memory cells including a second variable resistance material layer having a metallic doping concentration higher than a metallic doping concentration of the first variable resistance material layer. The first variable resistance memory cells are used as storage and the second variable resistance memory cells are used as a buffer memory.

An operating speed of the second variable resistance memory cells may be greater than an operating speed of the first variable resistance memory cells.

A reset current of the first variable resistance memory cells may be less than a reset current of the second variable resistance memory cells.

A storage capacity of the first variable resistance memory cells may be larger than a storage capacity of the second variable resistance memory cells.

The first variable resistance memory cells may have a multilayer structure.

The first and second variable resistance material layers may include one material group, or two or more material groups of materials including MTJ, MgO, NiO, TiO, SrO, SnO, SiN, TaO, HfO, ZrO, ZnO, CuO, SiO or $Al_2O_3$.

An endurance of the first variable resistance memory cells may be higher than an endurance of the second variable resistance memory cells.

The memory controller may be configured to distinguish a property of data received from an external device, select one of the first and second areas according to a result of the distinguishing and store the received data in the variable resistance memory cells of the selected area.

When the received data is continuous data, the memory controller may store the received data in the first variable resistance memory cells, and when the received data is random data the memory controller may store the received data in the second variable resistance memory cells.

The memory device and the memory controller may be embodied by a solid state drive.

An exemplary embodiment of the inventive concept provides a variable resistance memory device. The variable resistance memory device may include a memory cell array comprising a first area and a second area; and a control logic configured to write data in at least one of the first and second areas. The first area comprises first variable resistance memory cells including a first variable resistance material layer. The second area comprises second variable resistance memory cells including a second variable resistance material layer having a metallic doping concentration higher than a metallic doping concentration of the first variable resistance material layer. The first and second variable resistance memory cells and the control logic are formed on a same substrate.

An operating speed of the second variable resistance memory cells may be greater than an operating speed of the first variable resistance memory cells.

At least one of the first variable resistance memory cells may comprise: a first select device formed on the substrate; a first lower electrode formed between the first select device and the first variable resistance material layer; and a first upper electrode formed on a top of the first variable resistance material layer, and at least one of the second variable resistance memory cells may comprise: a second select device formed on the substrate; a second lower electrode formed between the second select device and the second variable resistance material layer; and a second upper electrode formed on a top of the second variable resistance material layer.

The first and second select devices may be connected to a word line and the first and second upper electrodes may be connected to a bit line, and resistances of the first and second variable resistance material layers may be changed depending on voltages of the word line and the bit line.

The first and second select devices include a diode or a transistor.

An exemplary embodiment of the present inventive concept provides a phase-change memory device. The phase-change memory device includes a memory cell array including a storage area and a buffer area, wherein the storage area includes first phase-change memory cells having a different composition than second phase-change memory cells of the buffer area.

A phase-change material layer of the buffer area may have a greater doping concentration than a phase-change material layer of the storage area.

A plurality of the first phase-change memory cells may be stacked on top of each other.

The first phase-change memory cells may have a lower operating current than the second phase-change memory cells.

The first or second phase-change memory cells may include germanium, antimony and tellurium.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
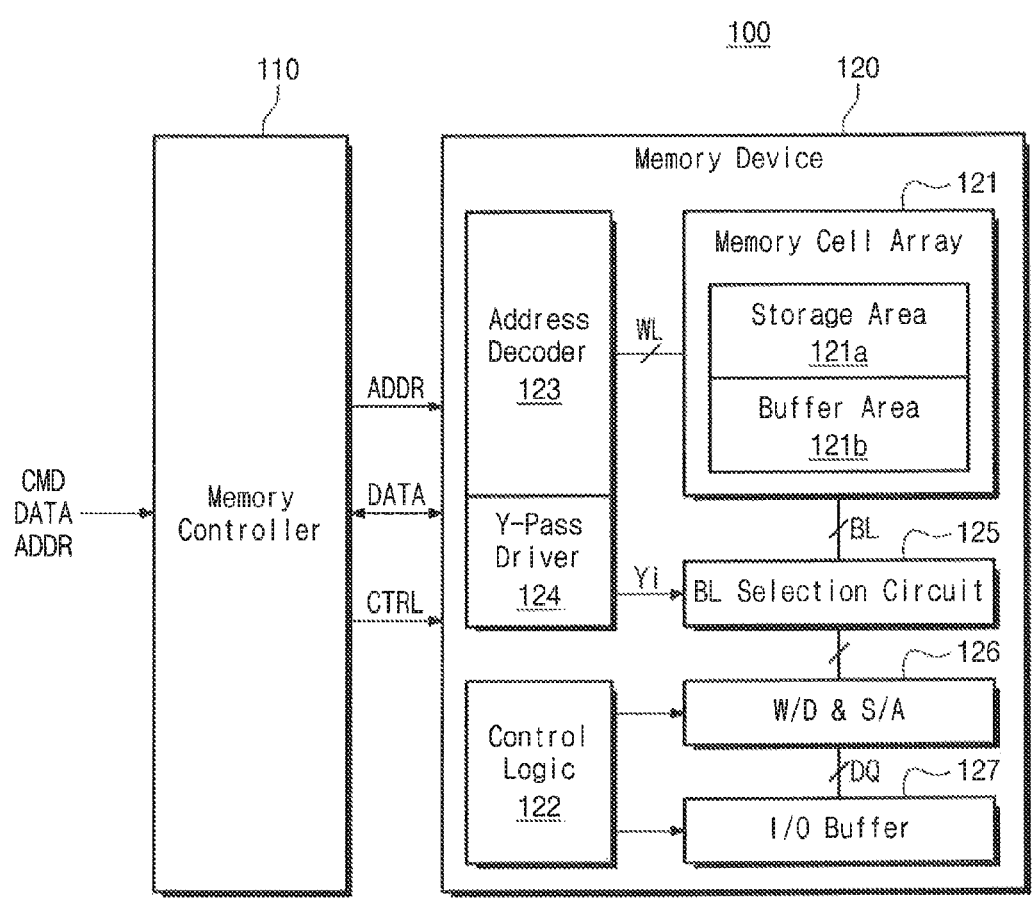
FIG. 1 is a block diagram illustrating a memory system in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will be understood that when an element is referred to as being "coupled to" or "connected to" another element, it may be directly coupled to or connected to the other element, or intervening elements may be present. Like reference numerals may refer to the like elements throughout the specification and drawings.

A phase-change memory system in accordance with an exemplary embodiment of the inventive concept includes a memory controller and a phase-change memory device. The phase-change memory device includes a memory cell array including a storage area and a buffer area. Phase-change memory cells included in the storage area and the buffer area have different compositions or different structures. For example, variable resistance materials of phase-change memory cells included in the buffer area can be formed to have a metallic doping concentration higher than variable resistance materials of phase-change memory cells included in the storage area. The phase-change memory cells included in the buffer area can be formed by doping a metallic material into a variable resistance material such as GST.

In an exemplary embodiment of the inventive concept, a reset current of the phase-change memory cells included in the storage area is lower than a reset current of the phase-change memory cells included in the buffer area. The phase-change memory cells included in the storage area have higher integration than the phase-change memory cells included in the buffer area. The phase-change memory cells included in the buffer area have an operation speed higher than the phase-change memory cells included in the storage area. The phase-change memory cells included in the storage area have higher endurance than the phase-change memory cells included in the buffer area. A structure of the memory controller may be simplified by using storage and a buffer memory as a phase-change memory. Thus, power consumption, and an input/output operation speed of a memory system (e.g., a solid state drive (SSD), a memory card, etc.) can be increased. Resistance to thermal damage can also be increased. The variable resistance memory system in accordance with an exemplary embodiment of the inventive concept may not use a circuit and constituent elements for sudden power off (SPO) by virtue of using a nonvolatile memory as storage and a buffer memory. Thus, the memory system can have increased performance.

FIG. 1 is a block diagram illustrating a memory system in accordance with an exemplary embodiment of the inventive concept. Referring to FIG. 1, a memory system 100 includes a memory controller 110 and a memory device 120. The memory system 100 may be a memory system such as an SSD, a memory card, a universal serial bus (USB) memory, etc. or a memory system included in a server system.

The memory controller 110 can receive a command CMD from an external device (for example, a host, application processor (AP), etc.) and can control the memory device 120 on the basis of the received command. The memory controller 110 can exchange data DATA with an external device on the basis of at least one of various interface protocols such as a USB protocol, a multimedia card (MMC) protocol, a peripheral component interconnect (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a universal flash storage (UFS) protocol, etc.

The memory device 120 is configured to operate according to control of the memory controller 110. The memory device 120 can be constituted by a variable resistance memory device such as a phase-change random access memory (PRAM), a magnetic RAM (MRAM), a resistive RAM (RRAM), a conductive bridge RAM (CBRAM), etc. In the current embodiment, the memory device 120 is constituted by a phase-change memory device. However, the inventive concept is not limited thereto.

The memory device 120 includes a memory cell array 121, control logic 122, an address decoder 123, a Y-pass driver 124, a bit line selection circuit 125, a write driver & sense amplifier 126 and an input/output buffer 127.

The memory cell array 121 includes a plurality of phase-change memory cells. The memory cell array 121 may include a storage area 121a and a buffer area 121b. The storage area 121a and the buffer area 121b may each include a plurality of phase-change memory cells. The phase-change memory cells may be formed to have a multilayer structure.

In an exemplary embodiment of the inventive concept, phase-change memory cells included in the buffer area 121b may have an operating speed greater than that of phase-change memory cells included in the storage area 121a. The phase-change memory cells included in the storage area 121a can operate by a reset current lower than that of the phase-change memory cells included in the buffer area 121b. The phase-change memory cells included in the storage area 121a can have an integration higher than that of the phase-change memory cells included in the buffer area 121b. The phase-change memory cells included in the storage area 121a can have better endurance than the phase-change memory cells included in the buffer area 121b. In other words, the memory device 120 can include one type of phase-change memory cells having high performance and another type of phase-change memory cells having low power consumption and high integration.

A characteristic of the phase-change memory cells described above can be achieved by making a composition and structure of the phase-change memory cells different without an increase to the complexity of a manufacturing method.

The control logic 122 can control the write driver & sense amplifier 126 to perform a write or a read operation of data stored in the memory cell array 121 in response to a control signal CTRL received from the memory controller 110.

The address decoder 123 is connected to the memory cell array 110 through a plurality of word lines WL. The address decoder 123 receives an address ADDR from the memory controller 110 and decodes the received address ADDR to select a word line of one of the word lines WL and then provide a word line voltage to the selected word line. The Y-pass driver 124 generates a select signal Yi for selecting a bit line BL. The select signal Yi is provided to the bit line selection circuit 125.

The write driver & sense amplifier 126 can write data DQ received from the input/output buffer 127 according to control of the control logic 122 or can read out data DQ stored in the memory cell array 121 to transmit it to the input/output buffer 127. The memory device 120 or constituent elements of the memory device 120 can be formed on a single chip.

As described above, the memory system 100 uses phase-change memory cells having different compositions and different structures as a storage and a buffer memory 121/121b. Since constitution such as a flash translation layer (FTL), an error correction code (ECC), etc. may not be needed by using the phase-change memory device as a storage and a buffer memory 121/121b, constitution of the memory controller 110 is simplified. Since the storage and the buffer memory 121/121b are constituted by a phase-change memory, a direct memory access (DMA) operation speed between the storage and the buffer memory 121/121b can be increased. Phase-change memory cells having different characteristics can be embodied through a material change such as metallic doping and thus a plurality of chips do not have to be used nor is there an increase to the complexity of a process. Thus, a memory system having increased performance and a reduced area is provided.

Figure 2:
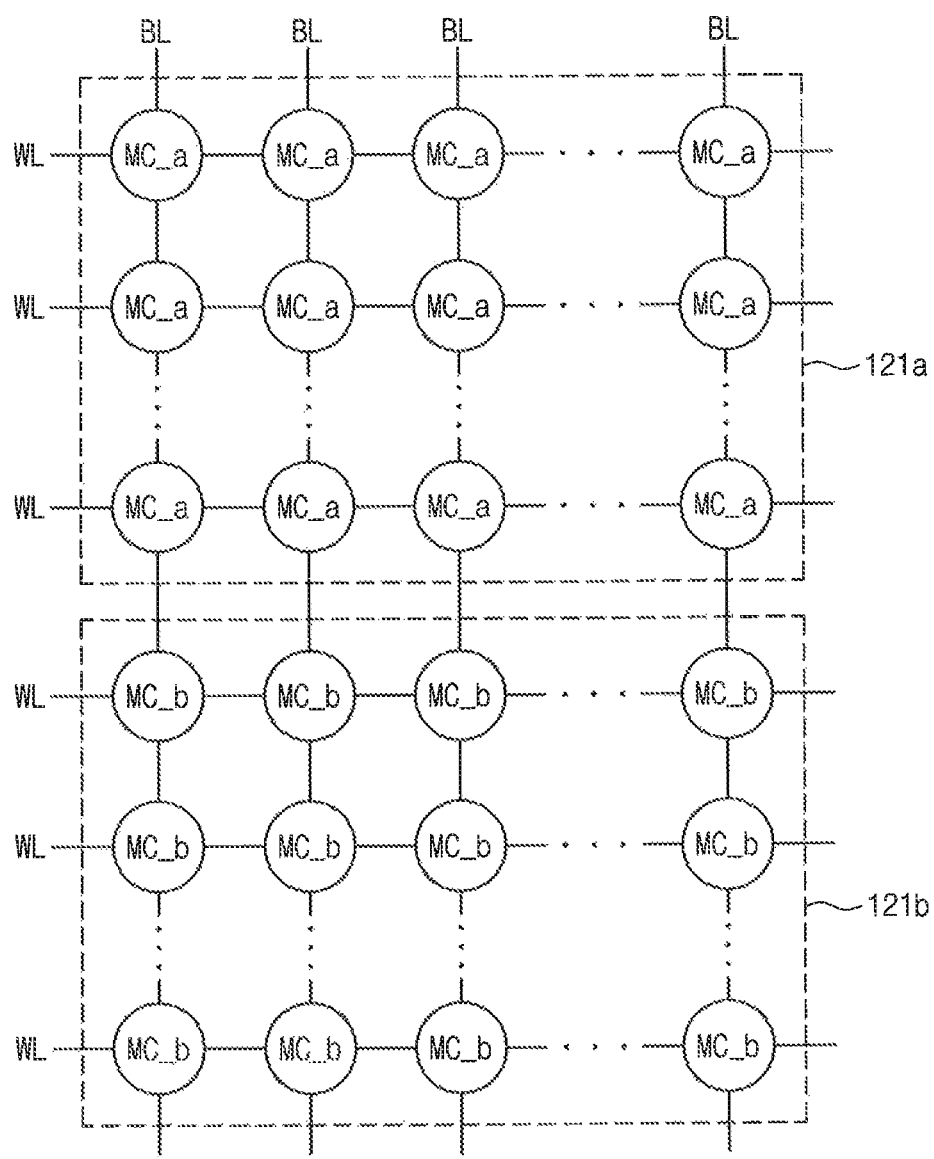
FIG. 2 is a drawing strafing a memory cell array illustrated in FIG. 1, according to an exemplary embodiment of the inventive concept.
Figure 3:
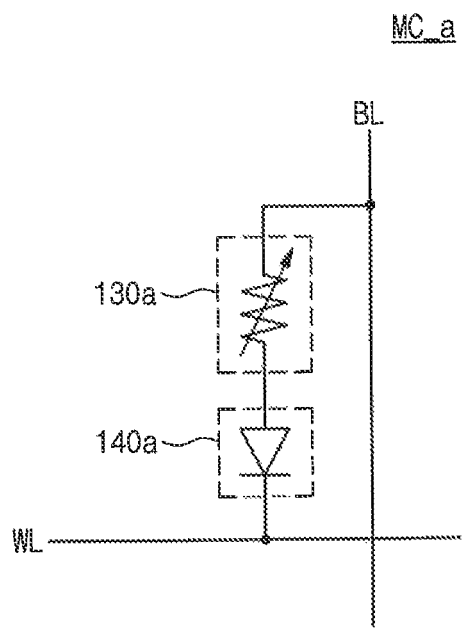
FIG. 3 is a circuit diagram illustrating a structure of a first phase-change memory cell illustrated in FIG. 2, according to an exemplary embodiment of the inventive concept.
Figure 4:
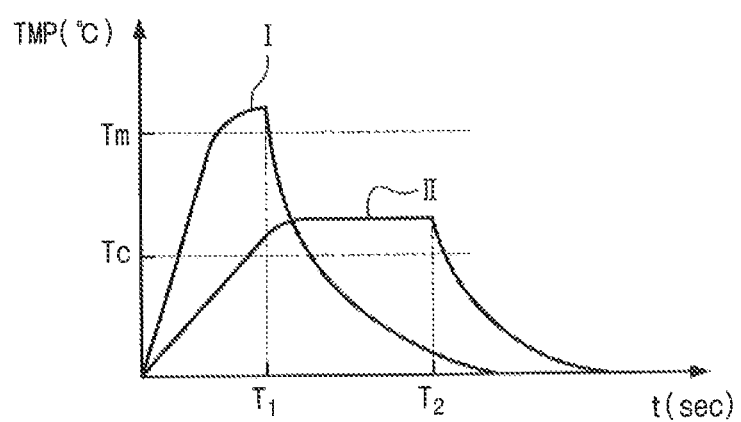
FIG. 4 is a graph for explaining a characteristic of a phase-change material.

FIG. 2 is a drawing illustrating a memory cell array illustrated in FIG. 1, according to an exemplary embodiment of the inventive concept. FIG. 3 is a circuit diagram illustrating a structure of a first phase-change memory cell illustrated in FIG. 2, according to an exemplary embodiment of the inventive concept. FIG. 4 is a graph for explaining a characteristic of a phase-change material.

Referring to FIGS. 2 and 3, the memory cell array 121 is connected to a plurality of word lines WL and a plurality of bit line BLs. The memory cell array 121 includes the storage area 121a and the buffer area 121b. The storage area 121a includes first phase-change memory cells MC_a and the buffer area 121b includes second phase-change memory cells MC_b. The first and second phase-change memory cells MC_a and MC_b are disposed at positions where the word lines WL and the bit lines BL cross one another.

The first and second phase-change memory cells MC_a and MC_b may have different compositions and different structures. For example, the first and second phase-change memory cells MC_a and MC_b each are constituted by a memory device 130a and a select device 140a as illustrated in FIG. 3. The memory device 130a includes a phase-change material GST. Phase-change materials GST included in the first and second phase-change memory cells MC_a and MC_b may have different compositions from one another.

A resistance of the phase-change material GST is changed depending on a temperature. An example of one such material is Ge—Sb—Te. The phase-change material GST has one state of two stable states (e.g., a crystalline state and an amorphous state) depending on a temperature. The phase-change material GST can be changed to a crystalline state or an amorphous state depending on a current being supplied to a bit line BL. The phase-change memory device can program data using a characteristic of the phase-change material GST described above.

The select device 140a can be constituted by a diode. An anode of the diode is connected to the memory device 130a and a cathode of the diode is a word line WL. If a voltage difference between the anode of the diode and the cathode of the diode is higher than a threshold voltage of the diode, the diode is turned on. If the diode is turned on, the memory device 130a is supplied with a current through the bit line BL. The select device 140a may be provided as a transistor.

Referring to FIG. 4, if cooling the phase-change material GST after heating the phase-change material GST at a temperature higher than a melting temperature Tm for certain time T1, a phase-change material layer changes to an amorphous state (I). If cooling the phase-change material GST after heating the phase-change material GST at a temperature lower than the melting temperature Tm and higher than a crystallization temperature Tc for certain time T2, a phase-change material layer changes to a crystalline state (II). Resistivity of a phase-change material having an amorphous state is higher than resistivity of a phase-change material having a crystalline state. Thus, it can be determined whether information stored in the phase-change material is logic "1" or logic "0" by sensing a current flowing through the phase-change material. A current for heating the phase-change material to an amorphous state is called a reset current.

A reset current of the phase-change memory cells included in the storage area 121a is smaller than a reset current of the phase-change memory cells included in the buffer area 121b. An operating speed of the phase-change memory cells included in the buffer area 121b is greater than an operating speed of the phase-change memory cells included, in the storage area 121a. Integration of the phase-change memory cells included in the storage area 121a is higher than integration of the phase-change memory cells included in the buffer area 121b.

In an exemplary embodiment of the inventive concept, a characteristic (for example, an operating speed, integration, or a level of a reset current) of the memory cells described above may be determined depending on the concentration of metallic doping included in variable resistance material. A characteristic of the memory cells described above may be determined depending on a structure (for example, a multi-layer structure) of the memory cells.

Figure 5:
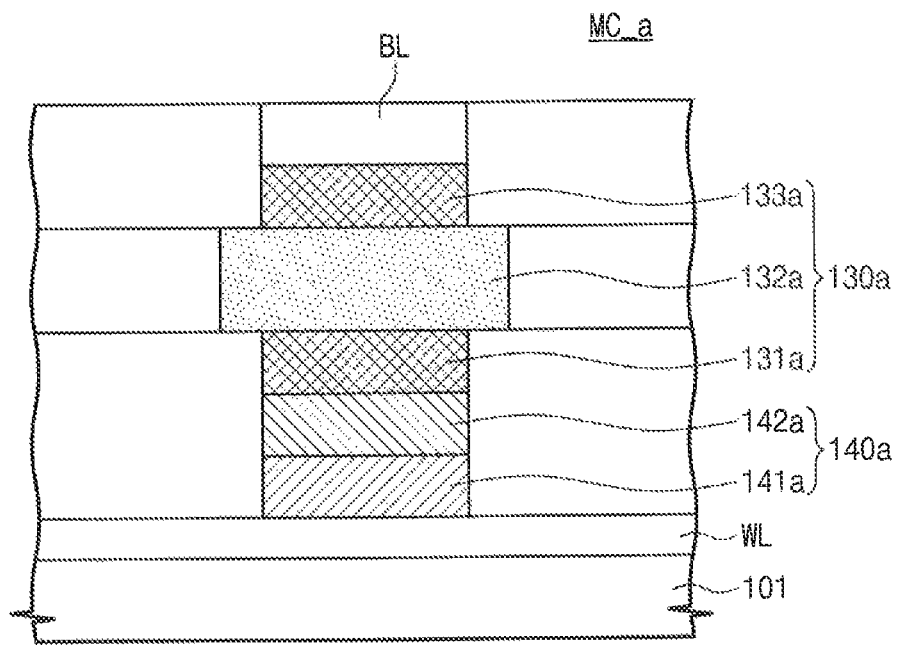
FIG. 5 is a cross sectional view of the first phase-change memory cell illustrated in FIG. 3, according to an exemplary embodiment of the inventive concept.

FIG. 5 is a cross sectional view of the first phase-change memory cell illustrated in FIG. 3, according to an exemplary embodiment of the inventive concept. The first phase-change memory cell MC_a is described with reference to FIG. 5. In the current embodiment, the select device 140a is a diode. However, the inventive concept is not limited thereto. The second phase-change memory cell MC_b may have a structure similar to a structure illustrated in FIG. 5 and the select device 140a can be provided as a transistor.

Referring to FIG. 5, a word line WL and a hit line BL crossing the word line WL may be provided on a semiconductor substrate 101. A variable resistance material layer having a memory function may be provided between the word line WL and the bit line BL. The variable resistance material layer may be a phase-change material layer 132a. The phase-change material layer 132a can be formed of a compound in which at least one of Te and Se, which are a chaleogenide system, is combined with at least one of Ge, Sb, Bi, Pb, Sn, Ag, As, S, Si, P, O or C. The variable resistance material layer 132a may be provided as one material group or two or more complex material groups of materials applied to an MRAM, or ReRAM, such as MTJ, MgO, NiO, TiO, SrO, SnO, SiN, TaO, HfO, ZrO, ZnO, CuO, SiO or $Al_2O_3$.

A lower electrode 131a and a select device 140a are provided between the phase-change material layer 132a and the word line WL. An upper electrode 133a is provided between the phase-change material layer 132a and the hit line BL. The lower electrode 131a, the phase-change material layer 132a and the upper electrode 133a can form the memory device 130a. The lower electrode 131a is electrically connected to the word line WL through the select device 140a and the upper electrode 133a is electrically connected to the bit line BL. The lower electrode 131a can be used as a heater for applying heat to the phase-change material layer 132a. The lower electrode 131a and the upper electrode 133a can be formed of a metallic thin film, titanium nitride (TiN) or titanium aluminum nitride (TiAlN).

The select device 140a may include an N-type semiconductor layer 141a and a P-type semiconductor layer 142a that are stacked on the substrate 101. The P-type semiconductor layer 142a is adjacent to the lower electrode 131a and the N-type semiconductor layer 141a is adjacent to the word line WL.

Phase-change material layers of the first and second phase-change memory cells MC_a and MC_b may have different compositions from each other. For example, a metallic doping concentration of a phase-change material layer of the second phase-change memory cells MC_b included in the buffer area 121b may be higher than a metallic doping concentration of a phase-change material layer of the first phase-change memory cells MC_a included in the storage area 121b. As a metallic doping concentration of a phase-change material layer increases, a reset current increases and an operating speed of a phase-change memory cell increases. In other words, if a phase-change material layer of the second phase-change memory cells MC_b is doped with a metallic material, the first phase-change memory cells MC_a can operate based on a reset current lower than the second phase-change memory cells MC_b. The second phase-change memory cells MC_b have an operating speed greater than the first phase-change memory cells MC_a.

The inventive concept is not limited to the embodiments described above. A metallic doping concentration of a phase-change material layer of the second phase-change memory cells MC_b included in the buffer area 121b can be formed to be higher or lower than a metallic doping concentration of a phase-change material layer of the first phase-change memory cells MC_a included in the storage area 121b, for example.

FIGS. 6A, 6B, 7A and 7B are drawings for explaining a method of forming first and second phase-change memory cells, according to an exemplary embodiment of the inventive concept. The first and second phase-change memory cells MC_a and MC_b may be formed on the same semiconductor substrate 101 and may be included in one memory cell array.

Figure 6A:
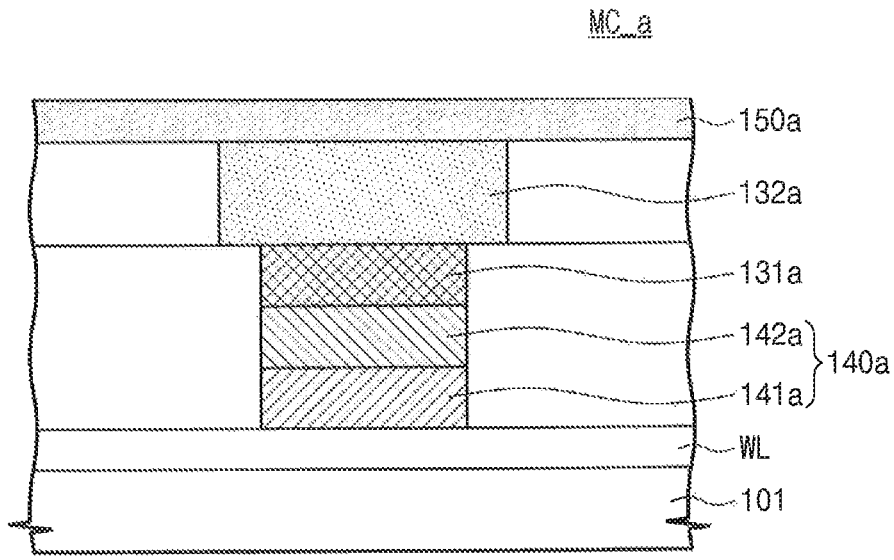
FIGS. 6A, 6B, 7A and 7B are drawings for explaining a method of forming first and second phase-change memory cells, according to an exemplary embodiment of the inventive concept.

A structure of the first phase-change memory cell MC_a is described with reference to FIG. 6A. A word line WL is formed on the substrate 101. A P-type semiconductor layer 141a is formed on a part of the word line WL. An N-type semiconductor layer 142a is formed on the P-type semiconductor layer 141a and a lower electrode 131a is formed on the N-type semiconductor layer 142a. A phase-change material layer 132a is formed on the lower electrode 131a.

Figure 6B:
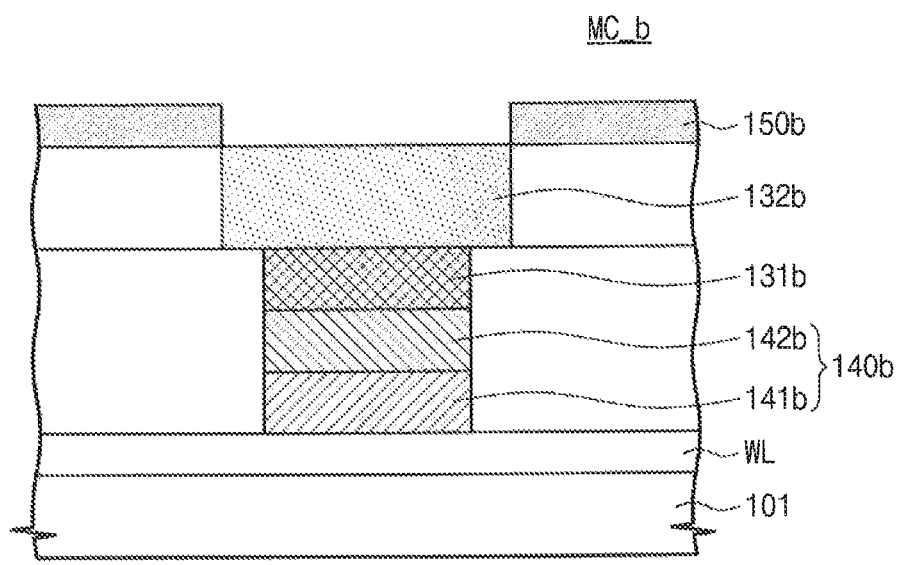

As shown in FIG. 6B, the second phase-change memory cell MC_b is formed to have the same with structure described above with reference to FIG. 6A. After that, masks 150a and 150b are formed on areas except for the phase-change material layer 132b of the second phase-change memory cells MC_b. The masks 150a and 150b have a function that prevents the phase-change material layer 132a from being doped with a metallic material.

Figure 7A:
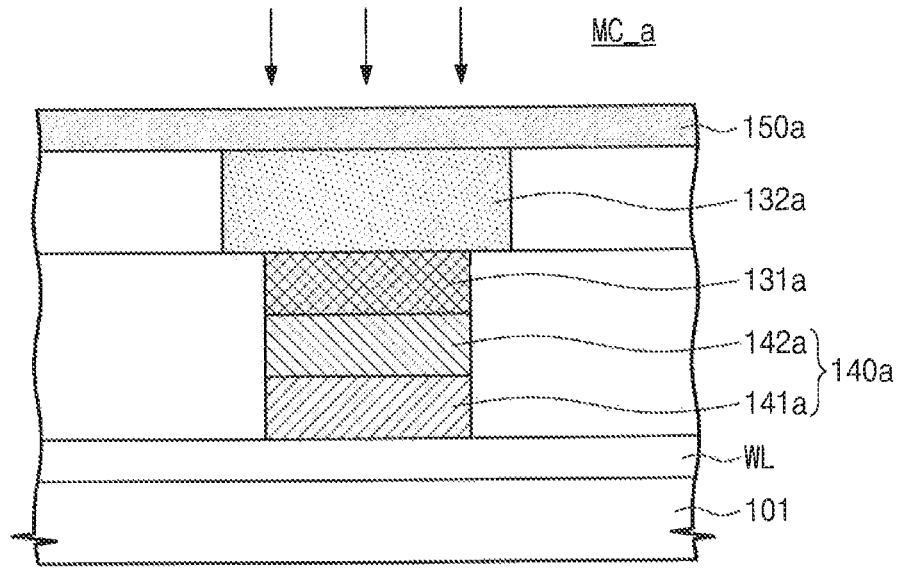
Figure 7B:
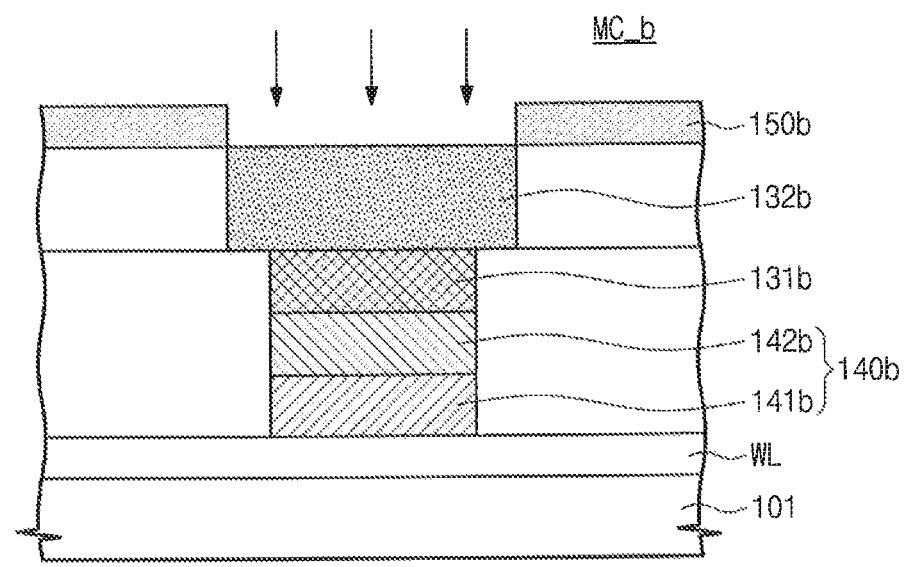

After that, as illustrated in FIGS. 7A and 7B, a top of the first and second phase-change memory cells MC_a and MC_b may be doped with a metallic material. Accordingly, the phase-change material layer 132b on which the masks 150a and 150b are not formed may be doped with a metallic material. Since the mask 150a is formed on a top of the first phase-change memory cell MC_a, the phase-change material layer 132a of the first phase-change memory cell MC_a is not doped with a metallic material. The phase-change material layer 132b of the second phase-change memory cells MC_b can be doped with a metallic material through a sputtering method.

According to the embodiment of the inventive concept described above, a variable resistance memory device includes a memory cell array including a storage area and a buffer area. Phase-change memory cells included in the storage area have low power and high integration and phase-change memory cells included in the buffer area have high performance by making a composition of phase-change material layers of phase-change memory cells included in the storage area and the buffer area different.

As described with reference to FIGS. 6A to 7B, when forming a phase-change material layer, by doping a metallic material after forming a mask on tops of phase-change memory cells included in the storage area, operation performance of phase-change memory cells included in the buffer area can be increased.

The memory controller 110 uses the first and second phase-change memory cells MC_a and MC_b formed according to the method described above as a storage memory and a buffer memory of the memory system 100 respectively and thereby a phase-change memory system having low power consumption, increased performance and high capacitance is provided.

Figure 8:
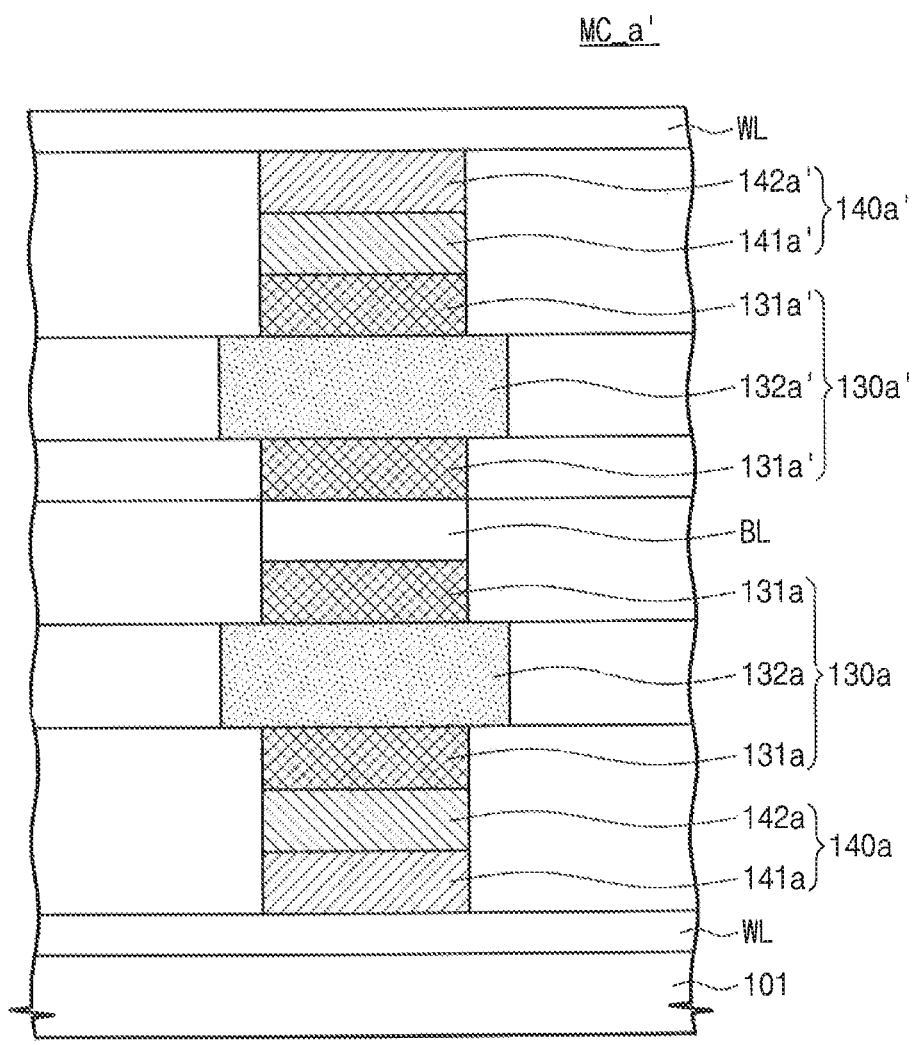
FIG. 8 is a cross sectional view of a first phase-change memory cell in accordance with an exemplary embodiment of the inventive concept.

FIG. 8 is a cross sectional view of the first phase-Change memory cell in accordance with an exemplary embodiment of the inventive concept. Referring to FIG. 8, the first phase-change memory cell MC_a' can be formed based on the method described with reference to FIGS. 6A through 7B. However, unlike the first phase-change memory cell MC_a of FIG. 5, the first phase-change memory cell MC_a' of FIG. 8 has a multilayer structure. A difference between the first phase-change memory cell MC_a of FIG. 5 and the first phase-change memory cell. MC_a' of FIG. 8 is mainly described below.

The first phase-change memory cell MC_a' is used as storage of the memory system 100. The storage of the memory system 100 may have characteristics of high capacitance, low power, etc. To increase integration of the first phase-change memory cell MC_a', as illustrated in FIG. 8, the first phase-change memory cell MC_a' may be formed to have a double structure. For example, the first phase-change memory cell MC_a', in addition to the structure illustrated in FIG. 5, may further include a memory device 130', a select device 140a' and a word line WL on the bit line BL.

When the double layer of the first phase-change memory cell MC_a' is formed, a mask may be formed on a top of the second phase-change memory cell MC_b. The mask can prevent a memory device, a select device and a word line from being stacked on a top of the second phase-change memory cell MC_b. Although not illustrated in FIG. 8, the second phase-change memory cell MC_b may have a multilayer structure.

As described with reference to FIG. 8, the first phase-change cell MC_a' has a double layer structure and thereby integration of the first phase memory cell MC_a' is increased. Thus, a phase-change memory device having reduced power consumption, increased performance and high capacitance is provided.

Figure 9:
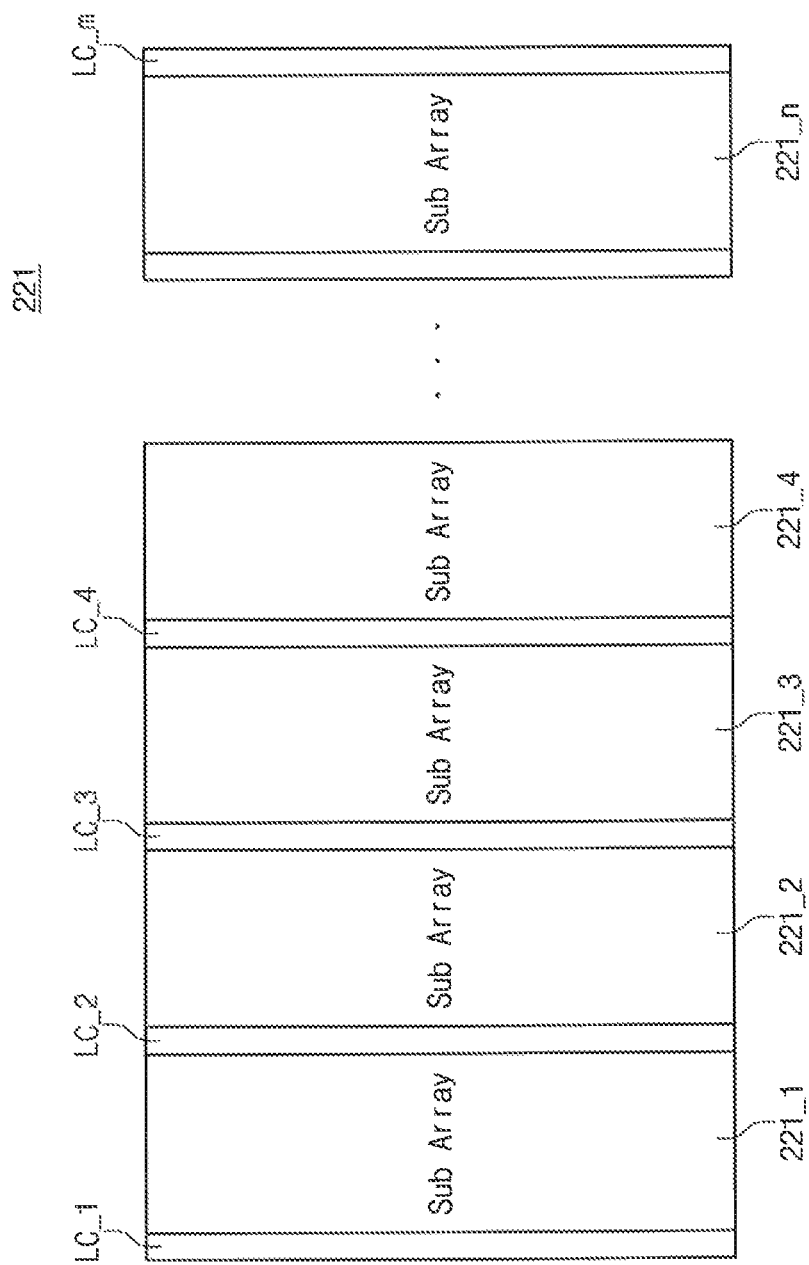
FIG. 9 is a drawing illustrating a memory cell array in accordance with an exemplary embodiment of the inventive concept.

FIG. 9 is a drawing illustrating a memory cell array in accordance with an exemplary embodiment of the inventive concept. Referring to FIG. 9, a memory cell array 221 includes a plurality of sub arrays 221_1~221_n and a plurality of logic circuits LC_1~LC_m. The sub arrays 221_1~221_n include a plurality of phase-change memory cells and are connected to a plurality of sub word lines. Each of the logic circuits LC_1~LC_m can be connected to the sub word lines. The logic circuits LC_1~LC_m can activate sub word lines corresponding to an activated word line. In other words, the logic circuits LC_1~LC_m may be a sub word line driver (SWD).

The memory cell array 221 may include a storage area and a buffer area. A part of sub arrays among the sub arrays 221_1~221_n is included in the storage area and the other part of sub arrays among the sub arrays 221_1~221_n is included in the buffer area. The sub arrays included in the storage area and the buffer area can operate based on the operation method described with reference to FIGS. 1 through 8 or can be formed based on the formation method described with reference to FIGS. 1 to 8.

Figure 10:
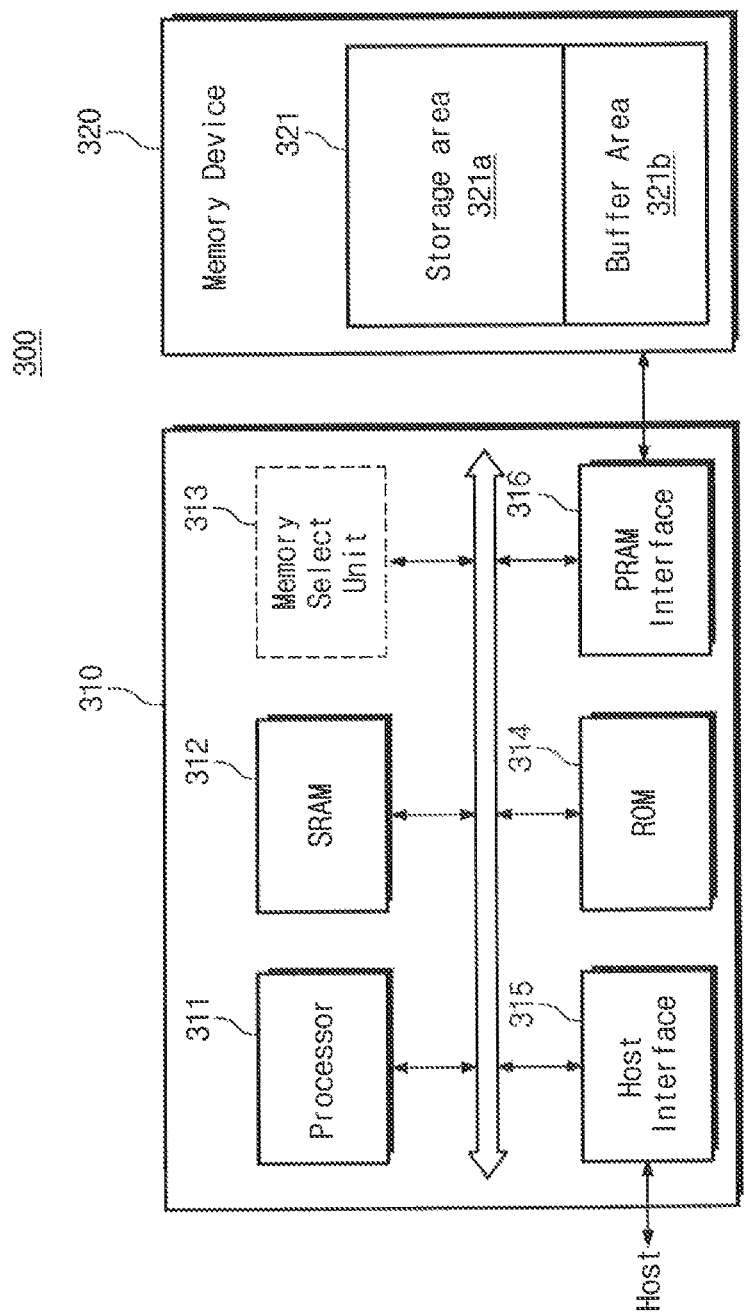
FIG. 10 is a block diagram illustrating a memory system in accordance with an exemplary embodiment of the inventive concept.

FIG. 10 is a block diagram illustrating a memory system in accordance with an exemplary embodiment of the inventive concept. Referring to FIG. 10, a memory system 300 includes a memory controller 310 and a memory device 320. The memory controller 310 include a processor 311, a static random access memory (SRAM) 312, a memory select unit 313, a read only memory (ROM) 314, a host interface 315 and a PRAM interface 316.

The processor 311 can control the operation of the memory controller 310. The processor 311 can drive firmware stored in the ROM 314. The SRAM 312 can be used as a cache memory of the processor 311.

The memory select unit 313 can distinguish a property of data DATA received from a host HOST. The data DATA received from the host HOST may be continuous data or random data. The continuous data may mean that data which belongs to a logical unit or a physical unit is related to one another. In other words, the continuous data indicates data that can be constituted by one logical unit or one physical unit such as large amounts of images or a moving image file. The random data indicates data which frequently receives a read request from the host HOST such as a database or meta data of a file.

If the received data DATA is determined to be continuous data, the memory select unit 313 stores the received data DATA in a storage area 321a of the memory device 320. If the received data DATA is determined to be random data, the memory select unit 313 stores the received data DATA in a buffer area 321b of the memory device 320. Performance of the memory system 300 can be increased by storing data which is input and output frequently in the buffer area 321b having a high operation speed. The memory select unit 313 is embodied and stored in the form of firmware and can be driven by the processor 311.

The memory controller 310 may exchange data and signals with the host HOST via the host interface 315 and exchange data and signals with the memory device 320 via the PRAM interface 316

The memory device 320 may operate under the control of the memory controller 310. The memory device 320 includes a memory cell array 321 including the storage area 321a and the buffer area 321b. The storage area 321a and the buffer area 321b were already described with reference to FIGS. 1 through 9 and thus a description of them is omitted. The memory device 320 can be formed on one substrate and can be embodied by one semiconductor chip.

The memory system 300 can support a DMA between the storage area 321a and the buffer area 321b. Since the storage area 321a and the buffer area 321b are provided based on a. PRAM of the same kind, a fast operating speed is guaranteed as compared with a DMA of a dynamic RAM (DRAM)-to-Flash.

According to an exemplary embodiment of the inventive concept, the memory system 300 is provided on the basis of a PRAM. Accordingly, since the memory controller 310 does not have to use constituent elements for controlling a flash memory such as FTL, ECC, etc. and constituent elements for controlling a buffer memory such as a buffer managing unit, a structure of the memory controller 310 is simplified.

By using a PRAM of the same kind as storage and a buffer memory of the memory system 300, a DMA time between the storage and the buffer memory is shortened and thus performance of the memory system 300 is increased.

Figure 11:
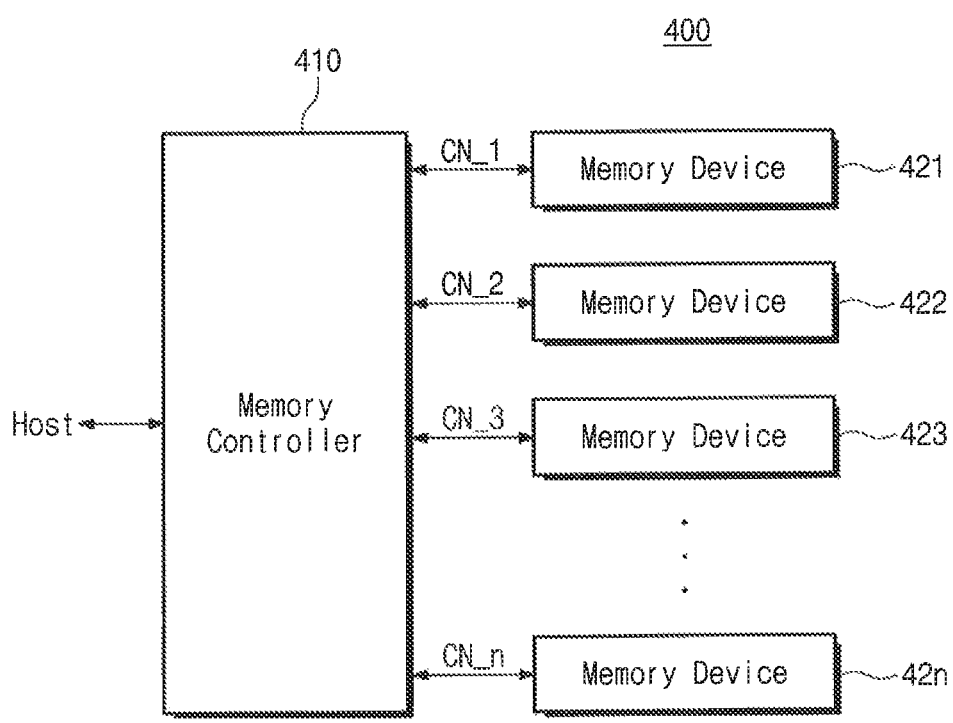
FIG. 11 is a block diagram illustrating a memory system in accordance with an exemplary embodiment of the inventive concept.

FIG. 11 is a block diagram illustrating a memory system in accordance with an exemplary embodiment of the inventive concept. A memory system 400 includes a memory controller 410 and a plurality of memory devices 421~42n. The memory controller 410 receives a command from an external device (for example, a host, AP, etc.) to control the memory devices 421~42n on the basis of the received command.

The memory devices 421~42n can operate under the control of the memory controller 410. The memory devices 421~42n may be the memory devices described with reference to FIGS. 1 through 10. Each of the memory devices 421~42n may include a memory cell array including a storage area and a buffer area.

A part of the memory devices 421~42n may be used as storage of the memory system 400 and the other part of the memory devices 421~42n may be used as a buffer memory. Memory devices used as storage of the memory system 400 among the memory devices 421~42n can be manufactured based on the formation method of the first phase change memory cell among the memory formation methods described with reference to FIGS. 6A to 7B. Memory devices used as a buffer memory of the memory system 400 among the memory devices 421~42n can be manufactured based on the formation method of the second phase-change memory cell among the memory formation methods described with reference to FIGS. 6A to 7B.

The memory devices 421~42n can be provided to different semiconductor chips respectively. The memory devices 421~42n can be provided as one package through a multi chip packaging (MCP).

According to an exemplary embodiment of the inventive concept, the memory system 400 uses a phase-change memory as storage and a buffer memory. Accordingly, since the memory controller 410 does not have to use constituent elements for managing a flash memory such as FTL, ECC, etc. and constituent elements for controlling a buffer memory such as a buffer managing unit, a structure of the memory controller 410 is simplified. Since the memory devices 421~42n are provided based on a PRAM of the same kind, performance of the memory system 400 is increased.

Figure 12:
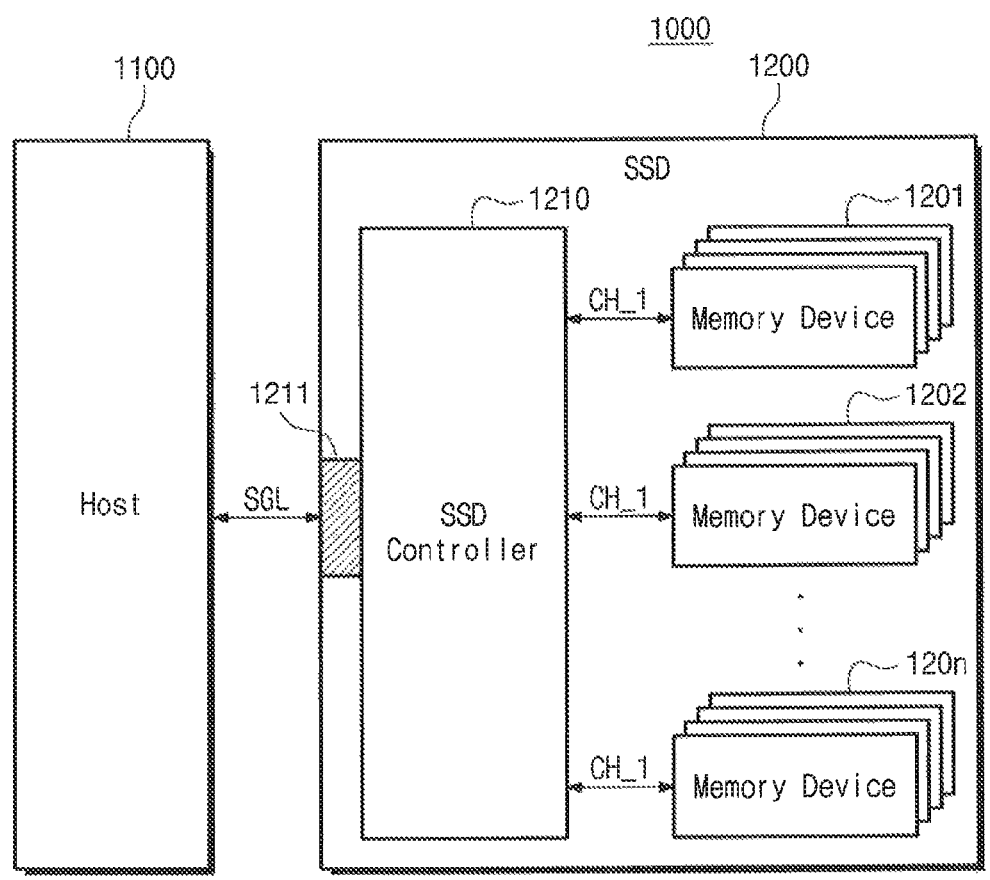
FIG. 12 is a block diagram illustrating a solid state drive (SSD) system including a memory system in accordance with an exemplary embodiment of the inventive concept.

FIG. 12 is a block diagram illustrating a SSD system including a memory system in accordance with an exemplary embodiment of the inventive concept. Referring to FIG. 12, a SSD system 1000 includes a host 1100 and an SSD 1200.

The SSD 1200 exchanges a signal with the host 1100 through a signal connector 1211. The SSD 1200 includes a plurality of memory devices 1201~120n and an SSD controller 1210. The memory devices 1201~120n and the SSD controller 1210 may be the memory device and the memory controller described with reference to FIGS. 1 through 12. The memory devices 1201~120n can be manufactured based on the formation method described with reference to FIGS. 6A through 7B.

The memory devices 1201~120n are used as storage and a buffer memory of the SSD 1200. A nonvolatile memory device such as a PRAM, an MRAM, an RRAM, a ferroelectric RAM (FRAM), etc. may be used as the SSD 1200. The memory devices 1201~120n can be connected to the SSD controller 1210 through a plurality of channels CH1~CHn. One or more memory devices can be connected to one channel. Memory devices connected to one channel can be connected to the same data bus.

The SSD controller 1210 exchanges a signal SGL with the host 1100 through the signal connector 1211. The signal SGL may include a command, an address, data, etc. The SSD controller 1210 writes data in a corresponding flash memory device or reads data from a corresponding flash memory device according to a command of the host 1100, for example.

Figure 13:
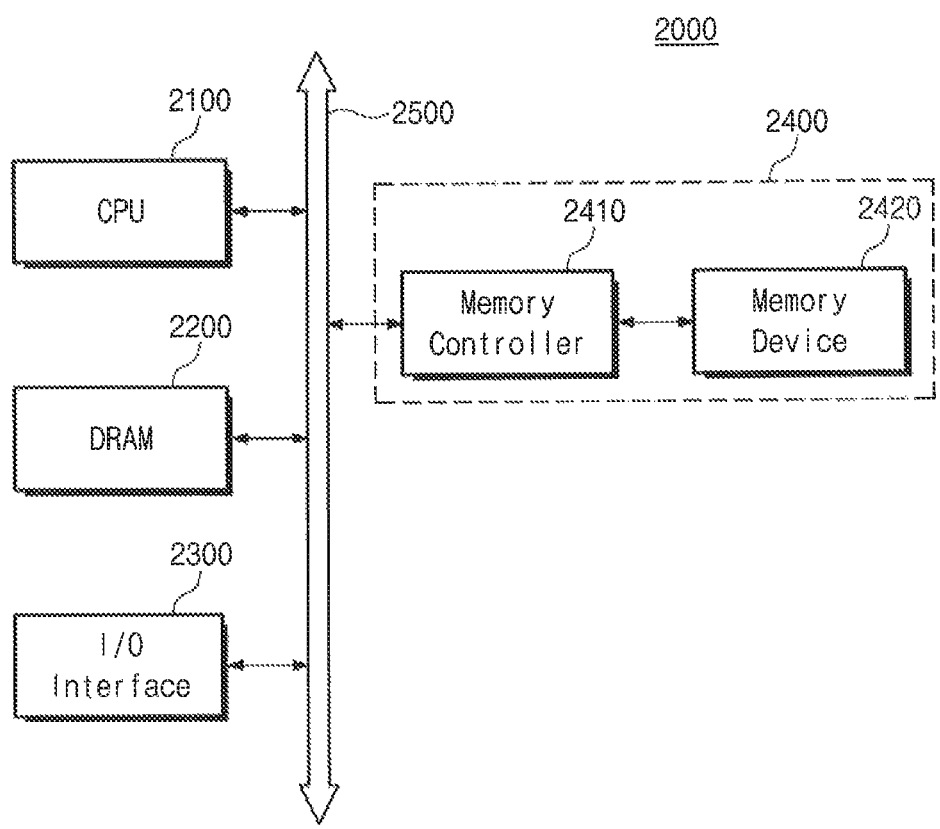
FIG. 13 is a block diagram illustrating a user system including a memory system in accordance with an exemplary embodiment of the inventive concept.

FIG. 13 is a block diagram illustrating a user system including a memory system in accordance with an exemplary embodiment of the inventive concept. A user system 2000 may be provided as one of computing systems such as a personal computer (PC), an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder and a digital video player.

Referring to FIG. 13, the user system 2000 includes a central processing unit (CPU) 2100, a DRAM 2200, an input/output interface 2300, a memory system 2400 and a system bus 2500. The CPU 2100 can control the operation of the user system 2000. The DRAM 2200 is a main memory device of the user system 2000 and can be used as a working memory or a buffer memory. The input/output interface 2300 includes various interfaces that input and output data and a control signal such as a keyboard, a display, a touch screen, a mouse, etc.

The memory system 2400 includes a memory controller 2410 and a memory device 2420. The memory system 2400 may include the devices described with reference to FIGS. 1 through 12 or the devices manufactured based on the formation method described with reference to FIGS. 6A through 7B. The system bus 2500 provides a transmission channel that can exchange data and a signal between constituent elements of the user system 2000.

According to an exemplary embodiment of the inventive concept, a variable resistance memory system is provided based on a phase-change memory. A memory cell array included in the variable resistance memory system includes a storage area and a buffer area. First phase-change memory cells of the storage area are used as storage of the variable resistance memory system and second phase-change memory cells of the buffer area are used as a buffer memory of the variable resistance memory system. Since the first and second phase-change memory cells have a different composition and different structures from each other, the second phase-change memory cells have an operating speed greater than the first phase-change memory cells. The first phase-change memory cells have a lower operating current (e.g., a reset current) and higher integration than the second phase-change memory cells.

By using a phase-change memory as storage and a buffer memory, a memory controller does not need constituent elements such as FTL, ECC, a buffer and a managing unit and thus a structure of the memory controller is simplified.

The variable resistance memory system in accordance with an exemplary embodiment of the inventive concept does not need a circuit and constituent elements for SPO by using a nonvolatile memory as storage and a buffer memory. In other words, a variable resistance memory device having reduced cost and increased performance and a variable resistance memory system including the same are provided.

While the inventive concept has been particularly shown and described with reference to exemplary embodiments thereof, it will be apparent to those of ordinary skill in the art that various changes and modifications may be made thereto without departing from the spirit and scope of the inventive concept as defined by the following claims.

What is claimed is:

1. A variable resistance memory system, comprising:
    a variable resistance memory device comprising a memory cell array including first and second areas; and
    a memory controller configured to control the variable resistance memory device,
    wherein the first area comprises first variable resistance memory cells including a first variable resistance material layer and the second area comprises second variable resistance memory cells including a second variable resistance material layer having a metallic doping concentration higher than a metallic doping concentration of the first variable resistance material layer, and
    wherein the first variable resistance memory cells are used as storage and the second variable resistance memory cells are used as a buffer memory.

2. The variable resistance memory system of claim 1, wherein an operating speed of the second variable resistance memory cells is greater than an operating speed of the first variable resistance memory cells.

3. The variable resistance memory system of claim 1, wherein a reset current of the first variable resistance memory cells is less than a reset current of the second variable resistance memory cells.

4. The variable resistance memory system of claim 1, wherein a storage capacity of the first area is larger than a storage capacity of the second area.

5. The variable resistance memory system of claim 1, wherein the first variable resistance memory cells have a multilayer structure.

6. The variable resistance memory system of claim 1, wherein the first and second variable resistance material layers include one material group, or two or more complex material groups of materials including MTJ, MgO, NiO, TiO, SrO, SnO, SiN, TaO, HfO, ZrO, ZnO, CuO, SiO or $Al_2O_3$.

7. The variable resistance memory system of claim 1, wherein an endurance of the first variable resistance memory cells is higher than an endurance of the second variable resistance memory cells.

8. The variable resistance memory system of claim 1, wherein the memory controller is configured to distinguish a property of data received from an external device, select one of the first and second areas according to a result of the distinguishing and store the received data in the variable resistance memory cells of the selected area.

9. The variable resistance memory system of claim 8, wherein when the received data is continuous data, the memory controller stores the received data in the first variable resistance memory cells, and
    when the received data is random data, the memory controller stores the received data in the second variable resistance memory cells.

10. The variable resistance memory system of claim 1, wherein the memory device and the memory controller are embodied by a solid state drive.

11. A variable resistance memory device, comprising:
    a memory cell array comprising a first area and a second area; and
    a control logic configured to write data in at least one of the first and second areas,
    wherein the first area comprises first variable resistance memory cells including a first variable resistance material layer,
    wherein the second area comprises second variable resistance memory cells including a second variable resistance material layer having a metallic doping concentration higher than a metallic doping concentration of the first variable resistance material layer, and
    wherein the first and second variable resistance memory cells and the control logic are formed on a same substrate.

12. The variable resistance memory device of claim 11, wherein an operating speed of the second variable resistance memory cells is greater than an operating speed of the first variable resistance memory cells.

13. The variable resistance memory device of claim 11, wherein at least one of the first variable resistance memory cells comprises:
    a first select device formed on the substrate;
    a first lower electrode formed between the first select device and the first variable resistance material layer; and
    a first upper electrode formed on a top of the first variable resistance material layer, and
    wherein at least one of the second variable resistance memory cells comprises:
    a second select device formed on the substrate;
    a second lower electrode formed between the second select device and the second variable resistance material layer; and
    a second upper electrode formed on a top of the second variable resistance material layer.

14. The variable resistance memory device of claim 13, wherein the first and second select devices are connected to a word line and the first and second upper electrodes are connected to a bit line, and
    wherein resistances of the first and second variable resistance material layers are changed depending on voltages of the word line and the bit line.

15. The variable resistance memory device of claim 14, wherein the first and second select devices include a diode or a transistor.

16. A phase-change memory device, comprising:
    a memory cell array including a storage area and a buffer area, wherein the storage area includes first phase-change memory cells having a different composition than second phase-change memory cells of the buffer area; and
    a control logic configured to write data into at least one of the first phase-change memory cells and the second phase-change memory cells.

17. The phase-change memory device of claim 16, wherein a phase-change material layer of each of the second phase-change memory cells has a greater doping concentration than a phase-change material layer of each of the first phase-change memory cells.

18. The phase-change memory device of claim 16, wherein the first phase-change memory cells are stacked on top of each other.

19. The phase-change memory device of claim 16, wherein each of the first phase-change memory cells has a lower operating current than each of the second phase-change memory cells.

20. The phase-change memory device of claim 16, wherein the first or second phase-change memory cells include germanium, antimony and tellurium.

* * * * *